United States Patent [19]

Toney et al.

[11] 4,377,832
[45] Mar. 22, 1983

[54] VOLTAGE TRANSIENT SUPPRESSOR CIRCUIT

[75] Inventors: John J. Toney, Scottsdale; Leland T. Brown, Phoenix, both of Ariz.

[73] Assignee: Motorola, Inc., Schaumburg, Ill.

[21] Appl. No.: 223,628

[22] Filed: Jan. 9, 1981

[51] Int. Cl.³ .............................................. H02H 3/20
[52] U.S. Cl. ........................................ 361/56; 361/91; 361/111; 307/252 R
[58] Field of Search .................... 361/56, 91, 111, 110, 361/88, 90; 307/252 F, 252 A, 252 R, 252 J, 252 K, 252 N, 252 Q, 302, 299 R, 252 T, 252 UA

[56] References Cited

U.S. PATENT DOCUMENTS

| | | | |
|---|---|---|---|
| 3,213,349 | 10/1965 | Gutzwiller | 361/56 X |
| 3,723,769 | 3/1973 | Collins | 307/252 UA |
| 3,878,434 | 4/1975 | Voorhoeve | 361/111 X |
| 3,894,269 | 7/1975 | Ahrens | 361/56 X |
| 3,997,833 | 12/1976 | Boyama | 361/56 |

FOREIGN PATENT DOCUMENTS 2363313  7/1974  Fed. Rep. of Germany ........ 361/56

*Primary Examiner*—Patrick R. Salce
*Attorney, Agent, or Firm*—Michael D. Bingham

[57] ABSTRACT

A circuit for use with telephony systems or the like for protecting these systems, which may be comprised of integrated circuits, from high transient voltages. The circuit includes a silicon controller rectifier (SCR) having the cathode and anode coupled between an input of the telephony system and earth potential. The gate of the SCR is coupled via a resistor to the cathode thereof and is also returned through a reversed-biased diode to a source of bias potential whereby negative voltage transients are shorted to earth potential such that the integrated circuits as well as the bias potential source are not damaged.

4 Claims, 2 Drawing Figures

VOLTAGE TRANSIENT SUPPRESSOR CIRCUIT

BACKGROUND OF THE INVENTION

1. Field of the Invention

This invention relates to voltage transient protection circuits and more particularly to a voltage transient suppressor circuit to protect integrated circuits from high negative transient voltages.

2. Description of the Prior Art

Hybrid circuits or subscriber loop interface circuits (SLICs) are known in the art which provide, for example, signal conversion between a balanced two-wire, bidirectional subscriber loop and a pair of unidirectional transmission paths. SLICs are required for connecting conventional telephone sets to telephone lines from electronic switching systems such as private automatic branch exchange (PABX) systems or telephone central office (CO), level five, switching circuit systems.

A conventional integrated circuit SLIC is manufactured by Motorola Inc. and is sold under the MC3419/3519 product number. The MC3419 is shown and described on page 6-30 in the Motorola Inc. "Linear Interface Integrated Circuits" Data Book, series C, copyrighted 1979. As described, the MC3419 SLIC is protected from high voltage transients occurring at the tip and ring terminals by a diode bridge coupled in conjunction with a pair of series current limiting resistors. These high voltage transients are created by lightning striking near telephone cables. Lightning created voltage transients are generally specified as being equal to a negative 1500 voltage spike of generally two milliseconds duration.

A problem that occurs with the aforementioned diode bridge, which will be more fully explained later, is that the negative voltage transients are caused to be shorted to the main minus 48 volt battery located at the central office. Thus, although the SLIC is protected therefrom, due to the two limiting resistors which are connected respectively to the tip and ring terminals in conjunction with the diode bridge, depending upon the number of telephone cables (sometimes upwards to 100 or more) thousands of amperes of current could cause to be discharged through this battery. Needless to say this is highly undesirable.

Another method utilized in the prior art for transient protection is to utilize a pair of fifty-volt Zener diodes coupled to the respective tip and ring lines. This method would work quite well except that the minus 48 volt battery located at the central office can actually vary in its output from between a minus 42 to minus 56 volts. Thus, if the Central Office battery is greater than minus 50 volts, the zener diodes are on all the time dissipating power and if the battery output is less than minus 50 volts, it is possible to damage the SLIC.

Thus, there is a need for a high voltage transient suppressor circuit suitable for use with SLICs to protect both the SLICs and the central office equipment from damage which could be otherwise caused by the high voltage transients.

SUMMARY OF THE INVENTION

Accordingly, it is an object of the present invention to provide an improved high voltage transient suppressor circuit.

It is another object of the present invention to provide a voltage transient protection circuit for use with a subscriber loop interface system or the like.

Still another object of the present invention is to provide a silicon controlled rectified (SCR) for protecting telephony systems from voltage transients.

In accordance with the above and other objects a suppressor circuit is provided for use with a subscriber carrier equipment including a subscriber loop interface circuit and central office equipment to protect the same from high voltage transients. The suppressor circuit comprises a silicon controlled rectifier (SCR) with the cathode being adapted to be coupled to either one of the tip or ring lines of the subscriber loop interface circuit; the anode of the SCR is adapted to be connected to a terminal which earth potential is supplied, the gate of the SCR is returned through a reverse biased diode to the central office equipment, more particularly a battery source, and is also returned via a resistor to the particular tip or ring line.

A feature of the present invention is that one suppressor circuit is utilized for each respective tip and ring line such that lightning induced voltage transients are shunted to earth potential and not through the central office battery source.

DETAILED DESCRIPTION OF THE PREFERRED EMBODIMENT

Figure 1:
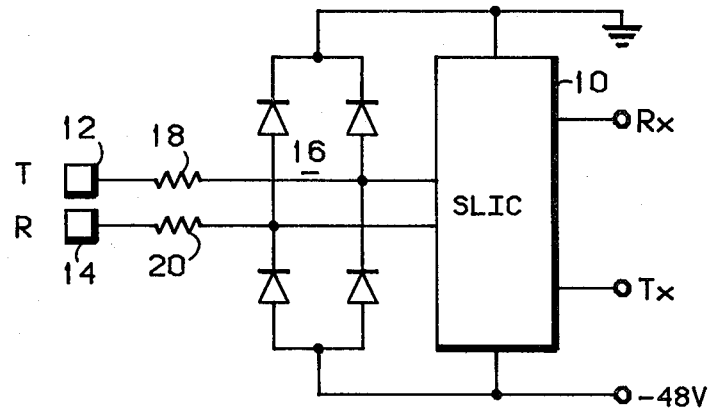
FIG. 1 is a schematic diagram showing a prior art voltage suppressor circuit in conjunction with a subscriber loop interface circuit.

A telephone line feed and two to four wire conversion circuit is shown in FIG. 1 which is described in the aforementioned Motorola Data Book. The conversion circuit includes a subscriber loop interface circuit (SLIC) 10 which, as known, is adapted to be connected between the central office equipment at the receive and transmit terminals $R_X$ and $T_X$ and a telephone set which would be coupled to tip and ring terminals T and R. The SLIC is operated from a minus 48 volt battery source supplied at the central office. Briefly, SLIC 10 is utilized to provide signal conversion from the balanced two-wire bidirectional subscriber loop comprising the telephone set and the unidirectional $R_X$ and $T_X$ transmission paths.

SLIC 10, being an integrated circuit, must be provided protection from voltage transients which may be induced at the tip and ring terminals 12 and 14 due to lightning strikes occurring in near vicinity thereof. As shown in FIG. 1, protection is provided by diode bridge 16 and series current limiting resistors 18 and 20 as is understood. Diode bridge 16 is coupled between earth potential and the minus 48 volt central office battery. Thus, a transient voltage occurring at tip or ring terminals will turn on one of the four diodes of diode bridge 16. The resistors 18 and 20 generally limit current to the diode to approximately 50 or 60 amperes.

The problem with the prior art transient suppressor circuit comprising diode bridge 16 occurs when a high negative voltage transient is induced on either the tip or ring terminals which causes the current through the diodes to be dissipated through the central office battery. If, lightning strikes near a cable that, for instance, may be carrying 100 or more telephone lines, it is not inconceivable that currents greater than 10,000 amperes could be dumped by the individual bridge circuits of each telephone line in combination through the central office battery with disasterous results.

Figure 2:
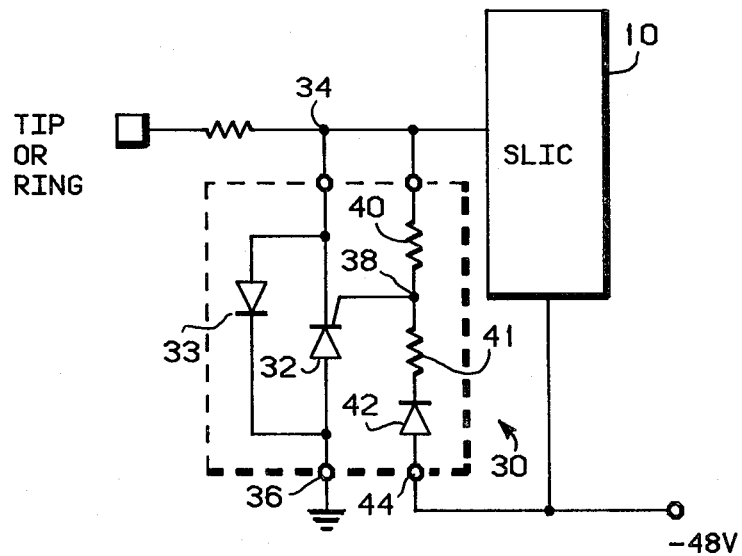
FIG. 2 is a schematic diagram of the present invention shown in combination with subscriber carrier equipment.

Turning to FIG. 2, there is shown a high voltage transient voltage suppressor circuit 30 to be utilized in conjunction with subscriber carrier equipment to protect the same from lightning induced voltage transients. Similar to FIG. 1, transient suppressor circuit 30 is to be utilized with SLIC 10 which provides signal conversion in the subscriber carrier loop. A transient suppressor circuit would be coupled to each tip and ring line as shown between the series limiting resistor and SLIC 10.

Voltage transient suppressor circuit 30 comprises a silicon controlled rectified (SCR) 32 having a cathode thereof coupled at node 34 to the particular tip or ring line. The anode of SCR 32 is adapted to be connected to earth potential at terminal 36 with the gate thereof being connected at node 38 between resistors 40 and 41. Resistor 40 is connected at its other lead to node 34; the other lead of resistor 41 being connected to the cathode of diode 42. The anode of diode 42 is adapted to be coupled to the central office battery at terminal 44. Suppressor circuit 30 is shown within a dashed outline to indicate that it may be manufactured as a semiconductor device. Additionally, a diode 33 may be connected between the anode and cathode of SCR 32 in reverse polarity thereto.

In response to a negative voltage transient appearing at the tip or ring terminals, SCR 32 is gated on to dump the current therethrough from limiting resistors 18 or 20 directly to earth ground potential instead of through the central office battery as the prior art systems do. SCR 32 is rendered nonconductive by SLIC 10 turning itself off due to the imbalance in line current due to the voltage transients to therefore inhibit the holding current through the SCR. The MC3419 SLIC described above is suitable for inhibiting the SCR holding current as aforementioned.

Thus, what has been described is a transient suppressor circuit to be utilized in combination with subscriber carrier equipment to protect the same from high voltage transients.

We claim:

1. In combination with subscriber carrier equipment including a battery source, the equipment being adapted to be coupled to a two-wire balanced subscriber loop, a circuit for protecting the equipment from negative voltage transients comprising a silicon controlled rectifier (SCR) having anode, cathode and gate electrodes, said anode electrode being coupled to a terminal at which is supplied earth potential, said cathode being coupled to one of said two wires of said balanced subscriber loop to the subscriber carrier equipment, said gate being coupled to an interconnect node; diode means coupled between said interconnect node and a terminal adapted to be coupled to the battery source; and circuit means for coupling said interconnect node to said one of said two wires; said SCR being rendered responsive to the negative voltage transients for directly shunting the transients to earth potential.

2. The circuit of claim 1 including another diode means coupled between said anode and cathode of said SCR in reverse polarity with respect thereto.

3. In combination with a subscriber loop interface circuit (SLIC) having first and second terminals adapted to be coupled to a two-wire balanced subscriber loop, a voltage transient suppressor circuit for protecting the SLIC and central office subscriber carrier equipment that is coupled to the SLIC from voltage transients comprising;
    a silicon controlled rectifier (SCR) having anode, cathode and gate electrodes, said cathode electrode being adapted to be coupled to the first terminal of the SLIC, said anode being adapted to be coupled to a terminal at which is supplied earth potential, and said gate electrode being coupled to a interconnect node;
    diode means coupled between said interconnect node and a terminal at which a source of operating potential is supplied from the central office subscriber carrier equipment; and
    circuit means for coupling said gate electrode to said first terminal, said SCR being rendered conductive to short negative voltage transients appearing at the first terminal to said earth potential.

4. A voltage transient suppressor circuit for use in combination with a subscriber loop interface circuit having a first and second terminal adapted to be coupled to a subscriber loop and further being coupled to a central office equipment loop which includes a source of operating potential, comprising:
    a silicon controlled rectifier (SCR) having an anode, a cathode, and a gate, said anode being coupled to a terminal at which is supplied an earth potential, said cathode being coupled to one of said first or second terminals of the subscriber loop interface circuit, said gate being coupled to an interconnect node;
    diode means coupled between said interconnect node and another terminal, said another terminal adapted to be coupled to said potential source of said central office equipment; and
    circuit means for connecting said gate to said first or second terminal of the subscriber loop interface circuit, the suppressor circuit causing negative voltage transients appearing on said first and second terminals to be shorted to earth potential.

* * * * *